(12) United States Patent
Jacobsson et al.

(10) Patent No.: US 10,178,819 B2
(45) Date of Patent: Jan. 8, 2019

(54) METHOD AND DEVICE FOR AUTOMATIC STORAGE OF ELECTRONIC COMPONENTS

(71) Applicant: MICRONIC MYDATA AB, Taby (SE)

(72) Inventors: Nils Jacobsson, Taby (SE); Kristofer Karlsson, Taby (SE)

(*) Notice: Subject to any disclaimer, the term of this patent is extended or adjusted under 35 U.S.C. 154(b) by 0 days.

(21) Appl. No.: 14/385,146

(22) PCT Filed: Mar. 12, 2013

(86) PCT No.: PCT/EP2013/055049
§ 371 (c)(1),
(2) Date: Sep. 12, 2014

(87) PCT Pub. No.: WO2013/135730
PCT Pub. Date: Sep. 19, 2013

(65) Prior Publication Data
US 2015/0014215 A1    Jan. 15, 2015

Related U.S. Application Data

(60) Provisional application No. 61/764,334, filed on Feb. 13, 2013, provisional application No. 61/609,691, filed on Mar. 12, 2012.

(51) Int. Cl.
*H05K 13/00* (2006.01)
*B65D 19/00* (2006.01)
(Continued)

(52) U.S. Cl.
CPC ......... *H05K 13/0084* (2013.01); *B65D 19/00* (2013.01); *B65D 85/62* (2013.01);
(Continued)

(58) Field of Classification Search
CPC .... H05K 13/00; H05K 13/04; H05K 13/0084; H05K 13/08; B65D 19/00; B65D 85/62; B65G 1/06
(Continued)

(56) References Cited

U.S. PATENT DOCUMENTS 5,235,164 A     8/1993  Noyama et al.
5,321,885 A *   6/1994  Hino ..................... B23P 21/004
                                                         209/573
(Continued)

FOREIGN PATENT DOCUMENTS

DE    4222709 A1    6/1993
EP    1147697 A1   10/2001
(Continued)

OTHER PUBLICATIONS

PCT/EP2013/055049—International Search Report dated Aug. 6, 2013, 3 pages.
(Continued)

*Primary Examiner* — Patrick D Hawn
(74) *Attorney, Agent, or Firm* — Haynes Beffel & Wolfeld LLP; Ernest J. Beffel, Jr.

(57) ABSTRACT

An automatic SMD storage tower has a shelfless interior for variable spacing of electronic component reels on pallets or as integral reel/guide units, with a great number of affixing locations on the interior of the SMD storage tower thereby increasing the storage capacity and ease of use. The technology disclosed also includes a reel pallet with shape defined places for holding a component reel and a tape guide with the component tape threaded therethrough.

8 Claims, 3 Drawing Sheets

(51) Int. Cl.
    *B65D 85/62*           (2006.01)
    *B65G 1/06*            (2006.01)
    *H05K 13/08*          (2006.01)

(52) U.S. Cl.
    CPC .............. *B65G 1/06* (2013.01); *H05K 13/086* (2018.08); *H05K 13/087* (2018.08)

(58) Field of Classification Search
    USPC .................................. 29/739, 740; 242/595
    See application file for complete search history.

(56) References Cited

U.S. PATENT DOCUMENTS

| | | | |
|---|---|---|---|
| 6,059,216 A | 5/2000 | Ogura | |
| 6,356,352 B1* | 3/2002 | Sumi | H05K 13/04 29/700 |
| 6,539,622 B2* | 4/2003 | Hidese | H05K 13/0417 198/358 |
| 6,546,619 B1* | 4/2003 | Shichi | H05K 13/0417 221/3 |
| 6,631,552 B2* | 10/2003 | Yamaguchi | H05K 13/08 29/739 |
| 6,631,870 B2* | 10/2003 | Bergstrom | H05K 13/0417 242/615 |
| 6,782,606 B2* | 8/2004 | Bergstrom | H05K 13/021 226/128 |
| 6,918,730 B2 | 7/2005 | Kawai et al. | |
| 6,971,157 B1* | 12/2005 | Yoshida | H05K 13/0452 29/720 |
| 6,996,440 B2* | 2/2006 | Maenishi | H05K 13/04 29/740 |
| 7,562,440 B2* | 7/2009 | Ito | H05K 13/021 226/128 |
| 7,899,561 B2 | 3/2011 | Maenishi et al. | |
| 7,930,819 B2* | 4/2011 | Yonemitsu | H05K 13/0417 226/76 |
| 7,930,821 B2* | 4/2011 | Nies | H05K 13/0069 29/739 |
| 8,179,259 B2 | 5/2012 | Bolotin et al. | |
| 8,528,196 B2* | 9/2013 | Kosaka | H05K 13/0452 29/739 |
| 8,764,935 B2 | 7/2014 | Kinoshita et al. | |
| 8,911,063 B2* | 12/2014 | Watanabe | H01L 21/67051 347/54 |
| 2003/0000959 A1 | 1/2003 | Desai et al. | |
| 2004/0193302 A1 | 9/2004 | Kou | |
| 2004/0237474 A1 | 12/2004 | Gregerson et al. | |
| 2008/0147232 A1 | 6/2008 | Kuribayashi et al. | |
| 2008/0217394 A1 | 9/2008 | Okada et al. | |
| 2010/0014948 A1* | 1/2010 | Higashida | H05K 13/0452 414/222.05 |
| 2012/0325885 A1 | 12/2012 | Nagao et al. | |
| 2016/0205819 A1 | 7/2016 | Jacobsson et al. | |
| 2016/0212899 A1 | 7/2016 | Jacobsson et al. | |
| 2016/0234985 A1 | 8/2016 | Jacobsson et al. | |
| 2016/0234986 A1 | 8/2016 | Jacobsson et al. | |

FOREIGN PATENT DOCUMENTS

| | | |
|---|---|---|
| EP | 1928221 A2 | 6/2008 |
| GB | 2262516 A | 6/1993 |
| JP | 2005089041 A | 4/2005 |
| WO | 03/024181 A1 | 3/2003 |

OTHER PUBLICATIONS

PCT/EP2013/055049—International Preliminary Report on Patentability and Written Opinion dated Sep. 16, 2014, 10 pages.
PCT/EP2013/055050—International Preliminary Report on Patentability and Written Opinion dated Sep. 10, 2014.
PCT/EP2013/055050—International Search Report dated Nov. 11, 2013, 6 pages.
U.S. Appl. No. 14/385,143—Office Action dated Apr. 11, 2016, 15 pages.
U.S. Appl. No. 14/385,143—Final Office Action dated Nov. 17, 2016, 9 pages.

* cited by examiner

METHOD AND DEVICE FOR AUTOMATIC STORAGE OF ELECTRONIC COMPONENTS

CROSS REFERENCE

This application is the US National stage of PCT Application No. PCT/EP2013/055049, filed Mar. 12, 2013, titled "METHOD AND DEVICE FOR AUTOMATIC STORAGE OF ELECTRONIC COMPONENTS" which claims priority to U.S. Provisional Patent Application No. 61/609,691 filed Mar. 12, 2012 entitled "STORING PALLETS WITH RANDOM HEIGHT IN A SHELF LESS STORAGE UNIT", and to U.S. Provisional Patent Application No. 61/764,334 filed Feb. 13, 2013 entitled "METHOD, SYSTEM AND DEVICE FOR AUTOMATED STORAGE AND RETRIEVAL OF COMPONENT TAPE REEL AND TAPE GUIDE UNIT IN AN AUTOMATED STORAGE UNIT, A SHELFLESS SMD STORAGE UNIT AND A SYSTEM AND METHOD FOR AUTOMATED HANDLING OF COMPONENT FEEDER AND REEL PACKAGE". The priority applications are hereby incorporated by reference.

TECHNICAL FIELD

The technology disclosed generally relates to the storage and retrieval of parts or materials used in the automated manufacturing of circuit boards. More specifically, the technology disclosed relates to efficient storage and retrieval of component carriers of various sizes in automatic storage unit to be used in the electronic component assembly process.

BACKGROUND ART

Electronic components come in many different sizes. A common way of delivering the components is on tape using a reel adapted to a certain type of tape, e.g. the width or size of the tapes. The tapes which carry the components come in different predefined widths, e.g. 8, 12, 16, 24, 23, 44 mm et cetera. Because the different types of reels stored in a storage unite have different widths, they also have different heights when stored horizontally in the storage unit.

Surface Mount Technology is now the preferred method of automated production of electronic printed circuit boards. So-called pick-and-place robotic machines are used in the process of placing and soldering electronic components to a printed circuit board (PCB). A plurality of pneumatic nozzles on small robot arms in the pick-and-place machine use suction to pick up a required component, such as a capacitor or a complete integrated circuit, and place them on a board, after jet spraying a pattern of adhesive on the board.

Machines for pick-and-lace mounting of components on a substrate, such as Printed Circuit Board (PCB), or a substrate for a System in Package (SiP) component are subject to different, often contradictory demands, such as mounting speed, mounting precision, size, price, etc. The expression "pick and place" is understood by the person skilled in the art as describing the very mounting operation where a mounting head is moved to a component feeder area, where the mounting head picks one or more components from one or more of the component feeders, and then is moved to a mounting area where the mounting head places the component or components on the substrate.

Such machines are capable of picking and placing upwards of 30000 components per hour on boards. Supplies of a certain type of component, such as a certain specified type of capacitor, resistor, diode or IC, are often delivered on trays of one type of component or on sticks or, as has become most common today, on tapes in reels with a series of pockets of appropriate depth in the tape, holding one component in each pocket. The reels have varying widths between 8 mm and 44 mm. A row of reels, each representing a different type of component, are placed in a magazine and feed components into the machine as the nozzle arms rapidly pick components out of their pockets and place them on the board. Component manufacturers deliver the components in standard reels of pocket-tape with a thin cover tape closing the pockets. This pocket cover tape must be removed by some method before the component can be picked out of its pocket.

Tape guides or feeders are used to feed the tape into the pick-and-place machine as the components are picked out of the pockets. One such tape guide is described in EP 1 381 265 B1. This type of component tape guide has no built-in tape advancing mechanism. Rather, the tape guide is mounted for use in the pick-and-place machine so that a feeding wheel in the pick-and-place machine protrudes through the tape guide into contact with the pre-threaded tape.

Each tape guide has a specific identity in relation to the pick-and-place machine and in whatever sequential position the reel with its pre-threaded tape guide is placed in the machine, the mounting machine robotics will properly find and pick up the proper components from the tape pockets. A method of associating the identity of the tape guide used to the specifics of the components in the tape threaded into the guide is described in EP 1 147 697 B1.

As known, the electronic components and in particular, SMD components, intended to be mounted on electronic boards in order to carry out precise functions, are wound in tapes or reels which are placed in stores or cabinets suitable for storage.

The single reels of SMD components, stored in said stores, are identified by a special code, for example of the bar type, which contains all the information relating to the type of electronic components contained in the single reels and the information relating to the location of the same reels in the store.

The reels of SMD components are managed in such stores according to manual, semi-automatic or automatic logics. In the case of a manual store, when the operator needs electronic components suitable for making an electronic board, he/she looks for the reel(S) into the store by the identification code and manually carries out the pick up and the subsequent replacement of the reels into the store in the positions marked by the code.

In the case of a semi-automatic or automatic store, the operator selects the reels he/she needs by the code and the system presents them one by one to the same operator. The pick up and the replacement of the single reels, in the case of a fully automatic store, can take place for example by a mechanical actuator that pick up/replaces the reel from its containment cell or seat.

DISCLOSURE OF INVENTION

The technology disclosed relates to an accumulator device for electronic components. In particular, the technology disclosed relates to an accumulator device especially suitable for being used in automatic or semi-automatic stores for storing electronic components, in particular reels or rolls of SMD (Surface Montage Devices) components.

The components in state of the art component storage units are store on shelf positions having fixed sizes and/or heights, which are often associated with and adapted to a certain size and/or width of a certain type of reel, which in turn depends on the size and width, e.g. 8, 12, 16, 24, 23, 44 mm, of the tape carrying the components.

The above-mentioned inflexibility of the storage unites of today gives rise to at least two problems:
1. Wrong mix of heights of the different shelf positions in the storage unite.
   a. The storage unit must be preconfigured with the correct mix of shelf heights and/or sizes depending on the mix of reel widths/sizes at the end user. This is hard to know in advance.
   b. When the preconfigured mix of shelf heights/sizes in the storage unit differs significantly from the real mix of reel widths/sizes, reels with small widths are store on high shelves and and/or certain types of reels cannot fit into empty shelves with low height, resulting in an inefficient use of the storage unit.
2. Shelves take space
   a. In order to be able to configure the storage unite, it may have been preconfigured for cassettes adapted for certain types of reels. The storage unite is then built up of a fixed mix of those cassettes. In addition, the cassettes and their design also use part of the volume to be used for storing reels.
   b. The shelves themselves in those cassettes take up a non-negligible portion of the space inside the storage unit.

The storage technology disclosed proposes to remove the shelves and the cassettes from the storage unit to save space and makes the storage unit more flexible and adapted to the needs of the user. Reels are usually stored on a pallet. The pallets are stiff and can act like a shelf for the reel. There are various sizes of the pallets, both in terms of height and diameter.

The storage technology disclosed proposes the introduction of a new type of flexible automatic storage device for storing components for surface mounting or assembly of electronic circuit boards, where the storage device is configured to temporarily affix pallets carrying electronic component tape reels to one of a plurality of locations on the interior of the automated storage device and where the automatic storage device is further provided with a deposition port adapted for automated storage and retrieval of the pallets carrying electronic component tape reels. The interior of the automatic storage device have a plurality of locations for automated storage of the component tape reels.

By introducing an automatic storage device configured to store electronic component tape reels on pallets and which is further being configured to temporarily affix, without providing any shelves for support in the automatic storage device, the pallets to one of a plurality of locations on the interior of the automated storage device, the above-identified limitations in inflexibility of today's semi-automatic or automatic storage units for storing components for surface mounting or assembly of electronic circuit boards is addressed.

The term pallet as used here is to be take in a broad sense and will be understood to include all types of transportable underlying horizontal supporting surfaces for the reels etc. such as plates, tables, platforms, trays etc.

The pallets often have a certain attach mechanism, e.g. a hook or a magnet-based coupling means, which enables it to be temporarily affixed to the interior wall of the storage unit at various heights at fixed positions.

Suitably there are a great number of possible affixing locations arranged in the interior of the storage unit, or accumulator device.

Example embodiments and advantages:
With component reels in a special designed pallet, the component tape guide can remain attached to the tape.
It will be easier to fill entire storage units with components with a random mix of high and low reels as there are no predefined locations for various heights.
Shelves and cassettes are not needed and the volume used for them can instead be used for storing components.
The manufacturing cost of shelves and cassettes can be eliminated. However, there will be a comparatively small added cost for the pallets.
Automatic storage of electronic production components will be more efficient as to time, cost and space.
Examples of other carriers than tapes in the pallets: The technology disclosed is applicable irrespective of what is placed on the pallet, for example it may be reels, JEDEC trays, small pieces of tape, tools etcetera.

DETAILED DESCRIPTION

Figure 1:
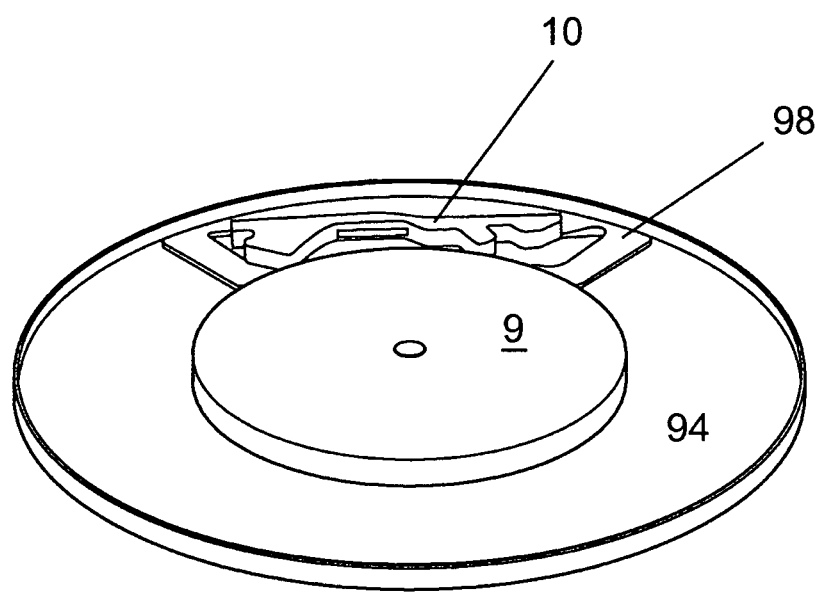
FIG. 1 shows a pallet holding a component tape reel and a tape guide

FIG. 1 shows in perspective a rimmed pallet 94 with a formed spacer element 98 which defines the exact placement of both the reel 9 and the tape guide 10. This is one non-limiting pallet design which can be used with advantage in the storage system according to the technology disclosed.

Figure 2:
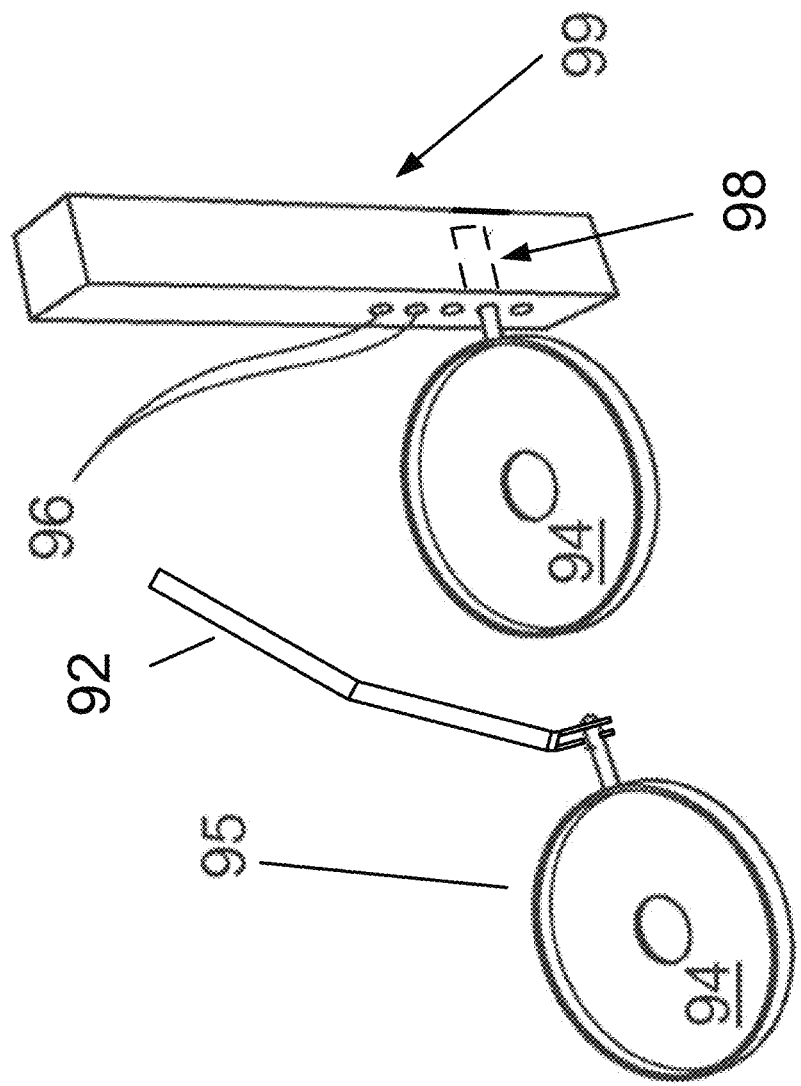
FIG. 2 shows schematically one embodiment of the storage unit interior frame with variable vertical spacing.

In the embodiment shown in FIG. 2 such a pallet with dedicated spaces for a component tape reel and its guide, the pallet 94 may have as an attachment means a pin 95 which is insertable into any of the holes 96 in the tower frame post 99 in the interior of the storage unit, in this case an SMD Tower. The attachment means 98, shown with dashed lines, supports temporarily affixing a pallet and horizontal by magnetic means, electronic means or latch means within the post 99. The illustration of attachment means is conceptual and not intended to define the size or shape of the attachment means. The robot arm 92 in the SMD tower will pick up the pallet at the deposit port 97 (shown in FIG. 3) of the SMD Tower and move it to a selected position on one of the posts in the interior of the SMD Tower. The illustration of robot arm is conceptual and not intended to define the size or shape of the robot arm. The software of the SMD Tower will calculate the optimal spacing and placement of the pallets to use the tower space most efficiently.

Figure 3:
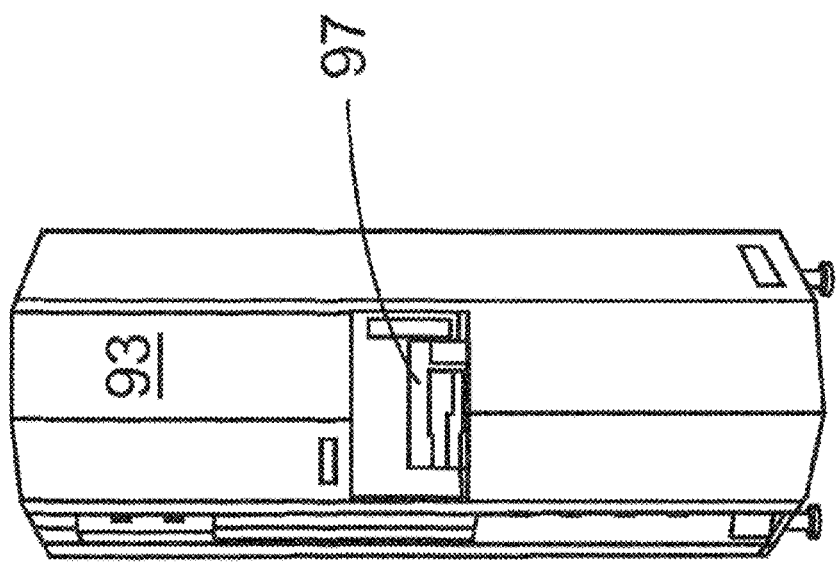
FIG. 3 illustrates a storage tower 93 which holds several tower frame posts.

It is of course possible to use other attachment means to affix the pallets in their place on the interior of the storage tower. Different forms of hooks, latches and electromagnets will be easily realized by the person skilled in the art when he wishes to implement the technology disclosed. FIG. 3, taken from priority application 61/764,334, illustrates a storage tower 93 which holds several tower frame posts 99. A deposition port 97 accepts electronic component tape reels for storage and presents them for retrieval, in the embodiment illustrated. The tower frame posts are on the interior of this tower.

According to a further embodiment of the technology disclosed, a pallet carrying a reel can be provided with means of attachment, or coupling means, adapted to attach the pallet to a corresponding means of attachment, or coupling means, in a selected place in the interior of the automatic storage device, where the two interacting means of attachment of a pallet and automatic storage device may be any means of attachment in form of magnetic, electronic and/or mechanical coupling means. Hence, the means for temporarily affixing the pallet to one of a plurality of locations on the interior of an automated storage device comprises at least one of a magnetic, electronic and/or mechanical means of attachment, or coupling means, adapted to interact with a plurality of means of attachment, or coupling means, on the interior of the automated component tape reel storage device.

According to a further embodiment of the technology disclosed, an electronics component tape reel can be made integral with its tape guide and the reel can then be provided with means of attachment to a selected place in the interior of the storage tower, e.g. means of attachment in form of magnetic, electronic and/or mechanical coupling means. thus, the means for temporarily affixing the pallet to one of a plurality of locations on the interior of an automated storage device comprises at least one of a magnetic electronic and/or mechanical means of attachment, or coupling means, adapted to interact with plurality of means attachment, or coupling means, on the interior of the automated component tape reel storage device to thereby attach the integral tape guide and reel to one of said locations on the interior of said automated storage device. In this further embodiment the reel will act as its own supporting means for storage at any desired location in the interior of the SMD tower.

We claim as follows:

1. A tower storage unit separate from a pick and place machine supplied with component tape reels from the tower storage unit, including:
   a storage cabinet with a deposition port through which component tape reels are inserted and retrieved wherein the component tape reel is part of a component tape assembly that includes a guide through which the component tape is threaded; and
   a robot arm inside the storage cabinet that transports a pallet carrying a component tape assembly between the deposition port and storage locations inside the storage cabinet, that positions the pallet to be affixed at a storage location when the pallet is being stored, and that supports the pallet as it is released from the storage location when the pallet is being retrieved,
   wherein the pallet has an upper surface, the component tape reel has an axis of rotation, and the component tape reel with the component tape threaded through the guide is stored on the pallet such that the axis of rotation is vertically oriented.

2. A storage device according to claim 1, wherein said pallets are each designed to hold a component tape reel and a pre-threaded tape guide, wherein the pre-threaded tape guide is pre-threaded with a component tape that is wound on the reel, but not otherwise connected to the component tape reel.

3. A storage device according to claim 1, wherein said pallet is affixed by magnetic means to one of a plurality of locations on the interior of said automated storage device.

4. A storage device according to claim 1, further including means for affixing a pallet to one of a plurality of locations on the interior of said automated storage device that comprises a pin integral with said pallet and insertable in a hole defining the selected location.

5. A storage device according to claim 1, further including means for affixing a pallet to one of a plurality of locations on the interior of said storage device that comprises at least one of a magnetic, electronic and/or mechanical means of attachment, or coupling means, configured to interact with means of attachment, or coupling means, of the pallet to thereby attach the pallet to one of said locations on the interior of said storage device.

6. The storage device of claim 1, further including an automated robot arm that affixes a pallet loaded at the deposition port with one of the electronic component tape reels to one of the plurality of locations on the interior of said storage device.

7. The storage device of claim 1, further including an automated robot arm that detaches the pallet from one of the plurality of locations on the interior of said storage device and presents it at the deposition port for retrieval of one of the electronic component tape reels.

8. The storage device according to claim 1, wherein:
   the storage device further includes an enclosure wall surrounding the interior of the storage device;
   the deposition port defines an opening through the enclosure wall.

* * * * *